US010339000B2

(12) United States Patent
Yang et al.

(10) Patent No.: US 10,339,000 B2
(45) Date of Patent: Jul. 2, 2019

(54) STORAGE SYSTEM AND METHOD FOR REDUCING XOR RECOVERY TIME BY EXCLUDING INVALID DATA FROM XOR PARITY

(71) Applicant: SanDisk Technologies LLC, Plano, TX (US)

(72) Inventors: Nian Niles Yang, Mountain View, CA (US); Grishma Shah, Milpitas, CA (US); Philip Reusswig, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 135 days.

(21) Appl. No.: 15/264,279

(22) Filed: Sep. 13, 2016

(65) Prior Publication Data
US 2018/0074891 A1 Mar. 15, 2018

(51) Int. Cl.
G06F 11/10 (2006.01)
G11C 29/52 (2006.01)
(Continued)

(52) U.S. Cl.
CPC .......... G06F 11/1068 (2013.01); G11C 29/52 (2013.01); H03M 13/13 (2013.01); H03M 13/373 (2013.01); H03M 13/3761 (2013.01); G06F 3/0626 (2013.01); G06F 3/0652 (2013.01); G06F 11/1004 (2013.01); G06F 11/1008 (2013.01); G06F 11/1032 (2013.01); G06F 11/1056 (2013.01); G06F 12/023 (2013.01); G06F 12/0238 (2013.01); G06F 12/0246 (2013.01); G06F 12/0253 (2013.01);
(Continued)

(58) Field of Classification Search
CPC ............ G06F 11/1004; G06F 11/1008; G06F 11/1032; G06F 11/1056; G06F 11/1068; G06F 12/023; G06F 12/0238; G06F 12/0246; G06F 12/0253; G06F 2212/70; G06F 2212/702; G06F 2212/7205; G06F 3/0626; G06F 3/0652; G11C 29/52; H03M 13/2906; H03M 13/2918; H03M 13/2942
See application file for complete search history.

(56) References Cited
U.S. PATENT DOCUMENTS 5,418,921 A * 5/1995 Cortney ............... G06F 11/1008
711/113
2011/0022791 A1* 1/2011 Iyer ......................... G06F 12/08
711/105
(Continued)

Primary Examiner — Christian M Dorman
(74) Attorney, Agent, or Firm — Dickinson Wright PLLC

(57) ABSTRACT

A storage system and method for reducing XOR recovery time are provided. In one embodiment, a storage system is provides comprising a memory and a controller. The controller is configured to generate a first exclusive-or (XOR) parity for pages of data written to the memory; after the first XOR parity has been generated, determine that there is at least one page of invalid data in the pages of data written to the memory; and generate a second XOR parity for the pages of data that excludes the at least one page of invalid data, wherein the second XOR parity is generated by performing an XOR operation using the first XOR parity and the at least one page of invalid data as inputs. Other embodiments are possible, and each of the embodiments can be used alone or together in combination.

21 Claims, 8 Drawing Sheets

(51) Int. Cl.
*H03M 13/29* (2006.01)
*H03M 13/13* (2006.01)
*H03M 13/37* (2006.01)
*G06F 3/06* (2006.01)
*G06F 12/02* (2006.01)

(52) U.S. Cl.
CPC .... *G06F 2212/70* (2013.01); *G06F 2212/702* (2013.01); *G06F 2212/7205* (2013.01); *H03M 13/2906* (2013.01); *H03M 13/2918* (2013.01); *H03M 13/2942* (2013.01)

(56) References Cited

U.S. PATENT DOCUMENTS

| | | | | |
|---|---|---|---|---|
| 2015/0019933 A1* | 1/2015 | Yamazaki | ............ | G06F 11/108 714/758 |
| 2016/0110111 A1* | 4/2016 | Song | ................ | G06F 3/0607 711/103 |
| 2016/0266965 A1* | 9/2016 | B | ..................... | G06F 11/108 |
| 2017/0091022 A1* | 3/2017 | Khan | ................ | G06F 11/1068 |

* cited by examiner

System table for XOR address map

| JB # | XOR Parity # | Original location address | Newl location address after XOR compaction |
|------|--------------|---------------------------|--------------------------------------------|
| A    | XOR parity A | 00h                       | 2Ah                                        |
| B    | XOR parity B | 01h                       | 10h                                        |
| C    | XOR parity C | 02h                       |                                            |
| C    | XOR parity D | 03h                       | 53h                                        |
| D    | XOR parity E | 04h                       |                                            |
| E    | XOR parity F | 05h                       |                                            |
| F    | XOR parity G | 06h                       | 16h                                        |
| ..... | ..... | ..... | ..... |
| ..... | ..... | ..... | ..... |

FIG. 7

STORAGE SYSTEM AND METHOD FOR REDUCING XOR RECOVERY TIME BY EXCLUDING INVALID DATA FROM XOR PARITY

BACKGROUND

An exclusive-or (XOR) operation can be used to create parity information for pages of data stored in a storage system, such as a solid-state drive (SSD), for example. XOR parity is often used to recover data in situations where other data-protection schemes (e.g., error correction code (ECC)) are unsuccessful. In practice, an XOR operation is performed as pages of data are written to memory, and the resulting XOR parity is stored. If a later attempt to read or write to one of the pages of data fails due to an uncorrectable error, the page of data can be recovered by performing a "de-XORing" operation on the XOR parity.

BRIEF DESCRIPTION OF THE DRAWINGS

FIG. 7 is a system table of an embodiment.

DETAILED DESCRIPTION

Overview

Figure 1A:
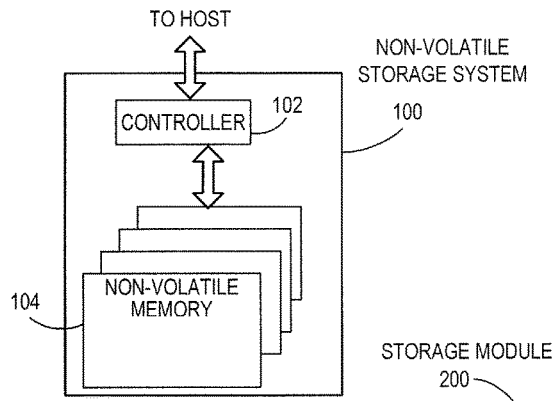
FIG. 1A is a block diagram of a non-volatile storage system of an embodiment.

By way of introduction, the below embodiments relate to a storage system and method for reducing XOR recovery time. In one embodiment, a storage system is provided comprising a memory and a controller. The controller is configured to generate a first exclusive-or (XOR) parity for pages of data written to the memory; after the first XOR parity has been generated, determine that there is at least one page of invalid data in the pages of data written to the memory; and generate a second XOR parity for the pages of data that excludes the at least one page of invalid data, wherein the second XOR parity is generated by performing an XOR operation using the first XOR parity and the at least one page of invalid data as inputs.

In some embodiments, the controller is further configured to determine if an amount of invalid data exceeds a threshold, and wherein the controller is configured to generate the second XOR parity in response to the amount of invalid data exceeding the threshold.

In some embodiments, the controller is further configured to store the first XOR parity in a first location in the memory and is also further configured to store the second XOR parity in a second location in the memory.

In some embodiments, the controller is further configured to update an address map table to associate the pages of data with the second XOR parity stored in the second location in the memory instead of the first XOR parity stored in the first location in the memory.

In some embodiments, the first XOR parity is generated for a block of pages.

In some embodiments, the first XOR parity is generated for a plurality of blocks of pages.

In some embodiments, the memory comprises a three-dimensional memory.

In some embodiments, the storage system is embedded in a host.

In some embodiments, the storage system is removably connected to a host.

In another embodiment, a method is provided that is performed in a storage system comprising a memory. The method comprises: creating parity information for units of data written to the memory by performing a cumulative exclusive-or (XOR) operation on the units of data as they are written to memory; determining that at least one unit of data is obsolete; and removing the at least one unit of obsolete data from the parity information by performing an XOR operation using the parity information and the at least one unit of obsolete data as inputs.

In some embodiments, the at least one unit of obsolete data is removed from the parity information in response to determining that an amount of obsolete data exceeds a threshold.

In some embodiments, the method further comprises storing new parity information resulting from removing the at least one unit of obsolete data from the parity information and updating a storage structure so that the units of data are associated with the new parity information.

In some embodiments, a unit of data is a page, and wherein the parity information is created for at least one block of pages.

In some embodiments, the memory comprises a three-dimensional memory.

In some embodiments, the storage system is embedded in a host.

In some embodiments, the storage system is removably connected to a host.

In another embodiment, a storage system is provided comprising a memory and means for removing at least one obsolete page of data from an exclusive-or (XOR) parity covering pages of data written to the memory.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
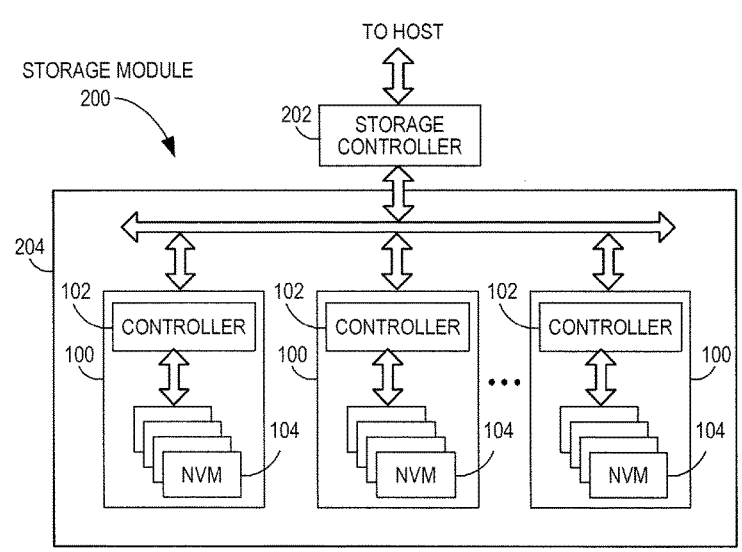
FIG. 1B is a block diagram illustrating an exemplary storage module of an embodiment.
Figure 1C:
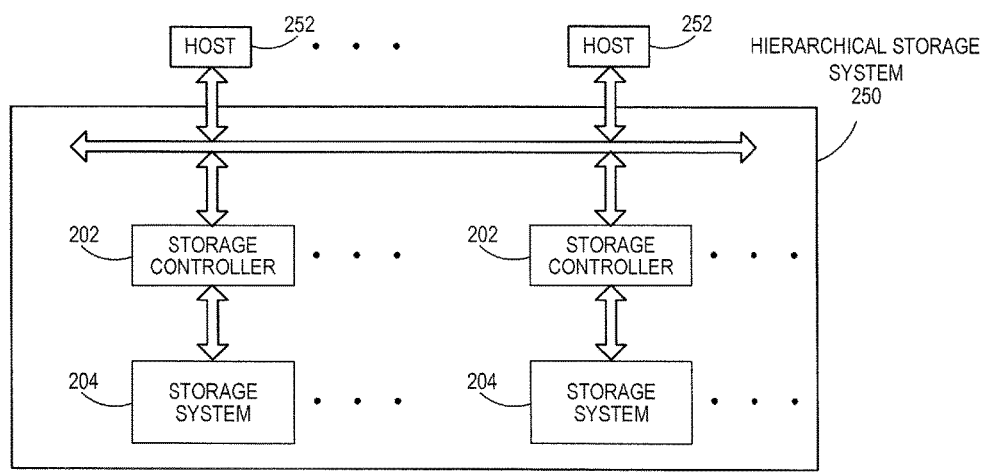
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
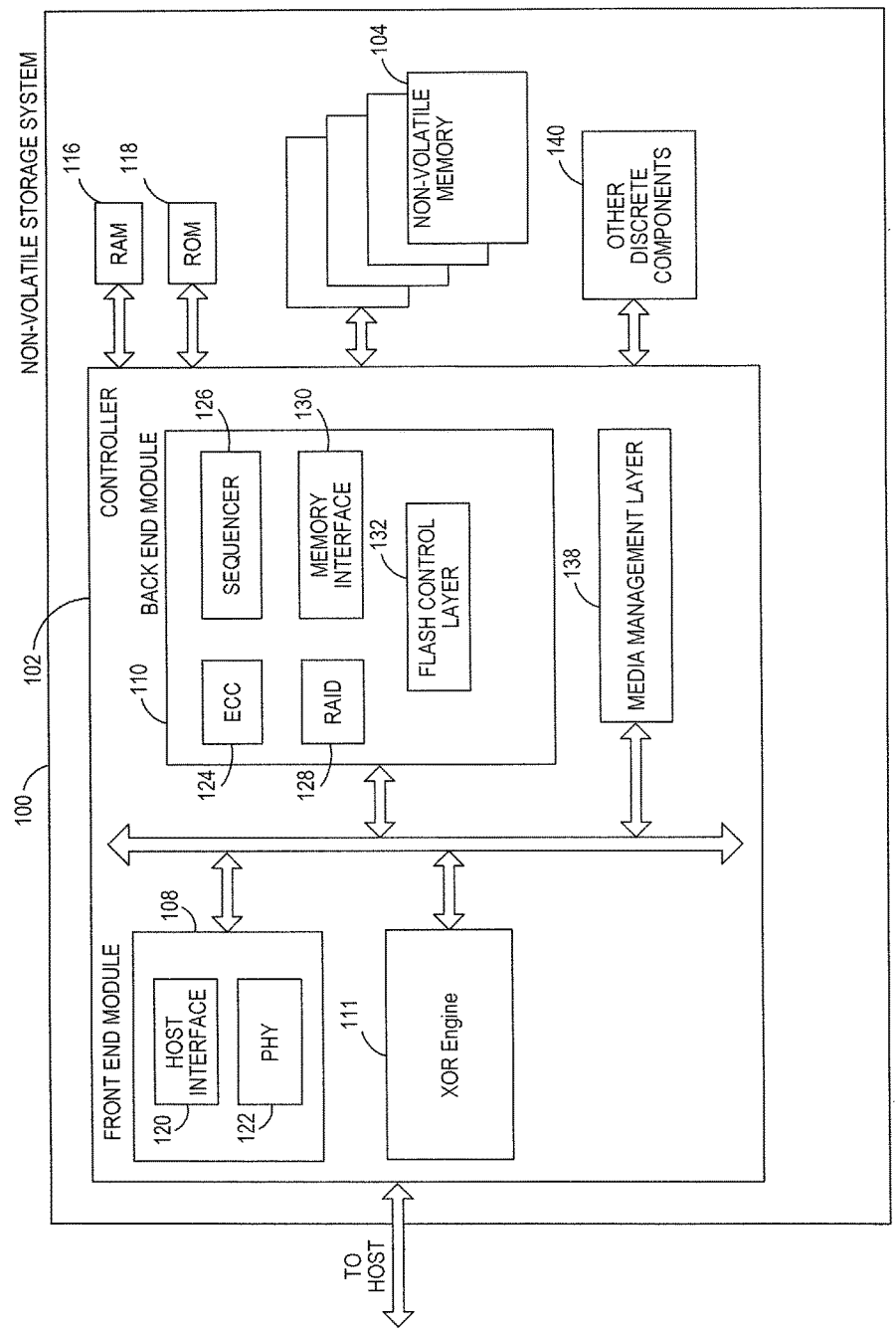
FIG. 2A is a block diagram illustrating exemplary components of the controller of the non-volatile storage system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include an exclusive-or (XOR) engine 111, which is discussed in more detail below. Implementation of the functionality of these modules will be discussed in more detail below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
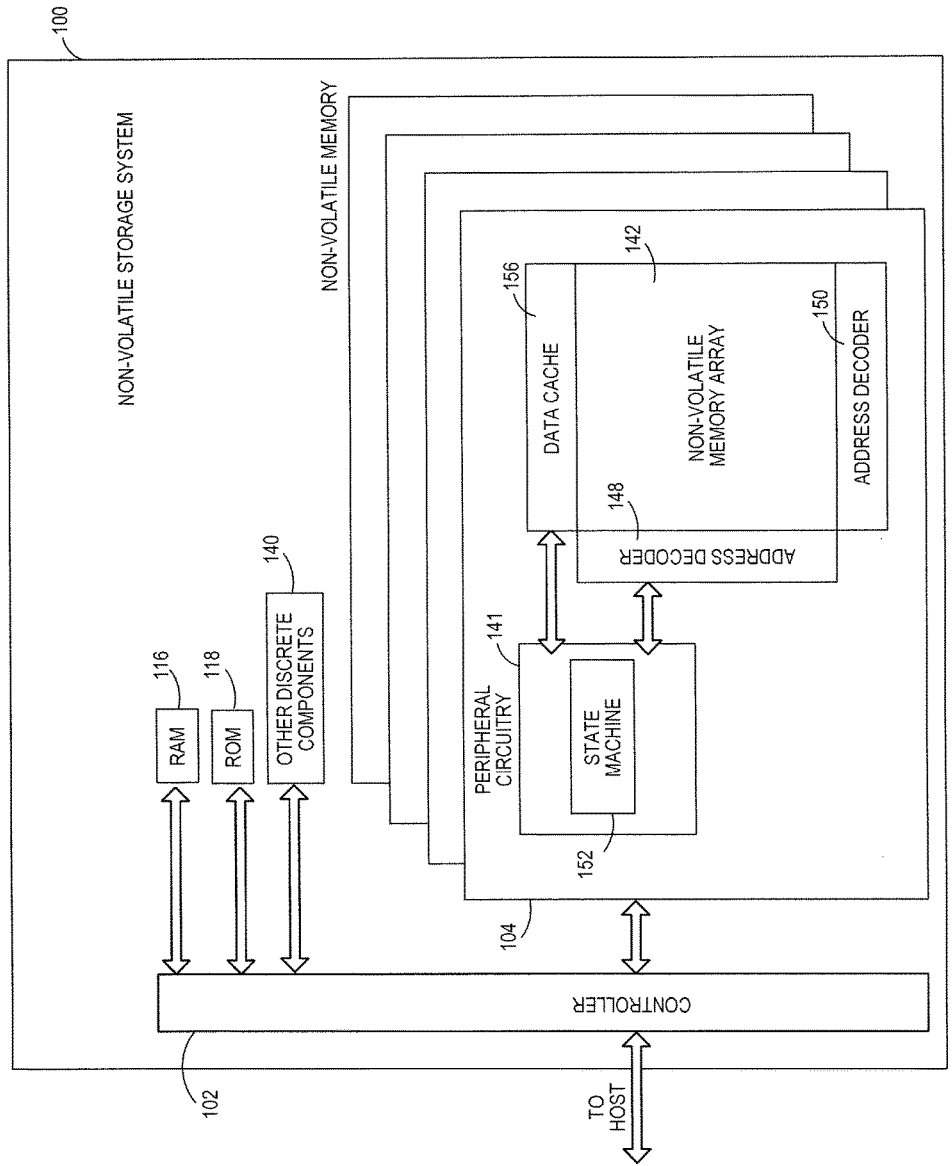
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As discussed above, an exclusive-or (XOR) operation can be used to create parity information for pages of data stored in a storage system, such as a solid-state drive (SSD), for example. An XOR operation refers to the logical operation that outputs a logical 1 (or 0) only when the inputs differ (i.e., one input is logical 1, and the other input is logical 0). The result of an XOR operation (sometimes referred to herein as XOR parity) can be used to recover data. In one embodiment, an XOR operation is performed as pages of data are written to memory, and the resulting XOR parity is stored. If the pages are of the same size, the XOR parity will have the same size as one of the pages. Accordingly, the XOR parity page is the cumulative XOR of all pages in a set of pages (e.g., a block or a plurality of blocks). Since XOR is an "in-place" operation, the size of the parity page does not increase as the number of pages being written increases.

XOR parity can be useful in situations where other data protection schemes (e.g., error correction code (ECC)) cannot recover data that has errors in it (e.g., due to defective memory cells). For example, due to the limited size of ECC parity bits, in some storage systems, ECC protection can only correct error rates of about 1.5%. If the ECC is not able to correct the error, XOR parity can be used to recover the entire page (in other situations, XOR parity can be used instead of ECC, so XOR parity could be the primary data protection scheme). So, if a later attempt to read or write to one of the pages of data fails due to an uncorrectable error, the page of data can be recovered by performing a "de-XORing" operation on the XOR parity. This is due to the XOR property that if "A XOR B=C", then "A=C XOR B" and "B=C XOR A". So, in this example, if C is the XOR parity, and A is the page that needs to be recovered, the storage system would read page B from the memory and XOR it with the XOR parity (C). However, if there are multiple pages in the XOR parity that have faulty data, the "de-XOR" process could fail, as XOR only protects a single error. This type of failure is sometimes referred to herein as an "XOR double failure."

Depending on how many pages are in the XOR parity and what page needs to be recovered, the "de-XORing" operation can take a relatively long time. For example, if the XOR parity covers 256 pages and the very first page needs to be recovered, the "de-XORing" operation would need to be performed 255 times, with 255 pages being read from the memory. Thus, using a "de-XORing" operation to recover a page can require many reads to memory to read every page that participates in the XOR parity.

With some types of solid-state non-volatile memory, a page of data can be invalid or obsolete after it is written, but the "de-XORing" operation is agnostic as to whether a given page has valid or obsolete data. This can lead to inefficiencies. For example, in some storage systems (e.g., those that use flash memory), data is written page-by-page, but data is erased as a block of pages. Accordingly, if a change needs to be made to a page (e.g., when a user modifies the data) or data is moved around (e.g., during a garbage collection process), the page of new data is written somewhere else in the memory, and a logical-to-physical address map is updated to indicate that the current version of the data is stored in the new location. The original page still stores the originally-written data, but the data is useless since it is obsolete/invalid. Nevertheless, due to the nature of the "de-XORing" process, time must be spent "de-XORing" an obsolete page in order to reach a valid page that is to be recovered.

The following embodiments provide for a more-efficient "de-XORing" operation by removing obsolete pages from the XOR parity. That way, when a valid page needs to be recovered, the storage system does not waste time "de-XORing" invalid pages. That is, compacting the pages participating in the XOR parity can lead to shorter "de-XOR" latency and less probability of an XOR double failure. In one embodiment, XOR parity compaction takes advantage of the following principle of an XOR operation: A⊕B⊕C⊕C=A⊕B. That is, to remove invalid page(s) from the XOR parity, an XOR operation can be performed using the XOR parity and the invalid page(s) as inputs (i.e., get rid of C from the XOR parity by applying C to the XOR parity). (An XOR bit map can be built to indicate which pages of data are contained in the XOR parity after the compaction.) Removing invalid pages from the XOR parity can reduce XOR recovery time (in some typical use cases, by over 20%) because fewer pages need to be "de-XORed." This enhances recovery efficiency and also helps avoid "XOR double failure."

Figure 3:
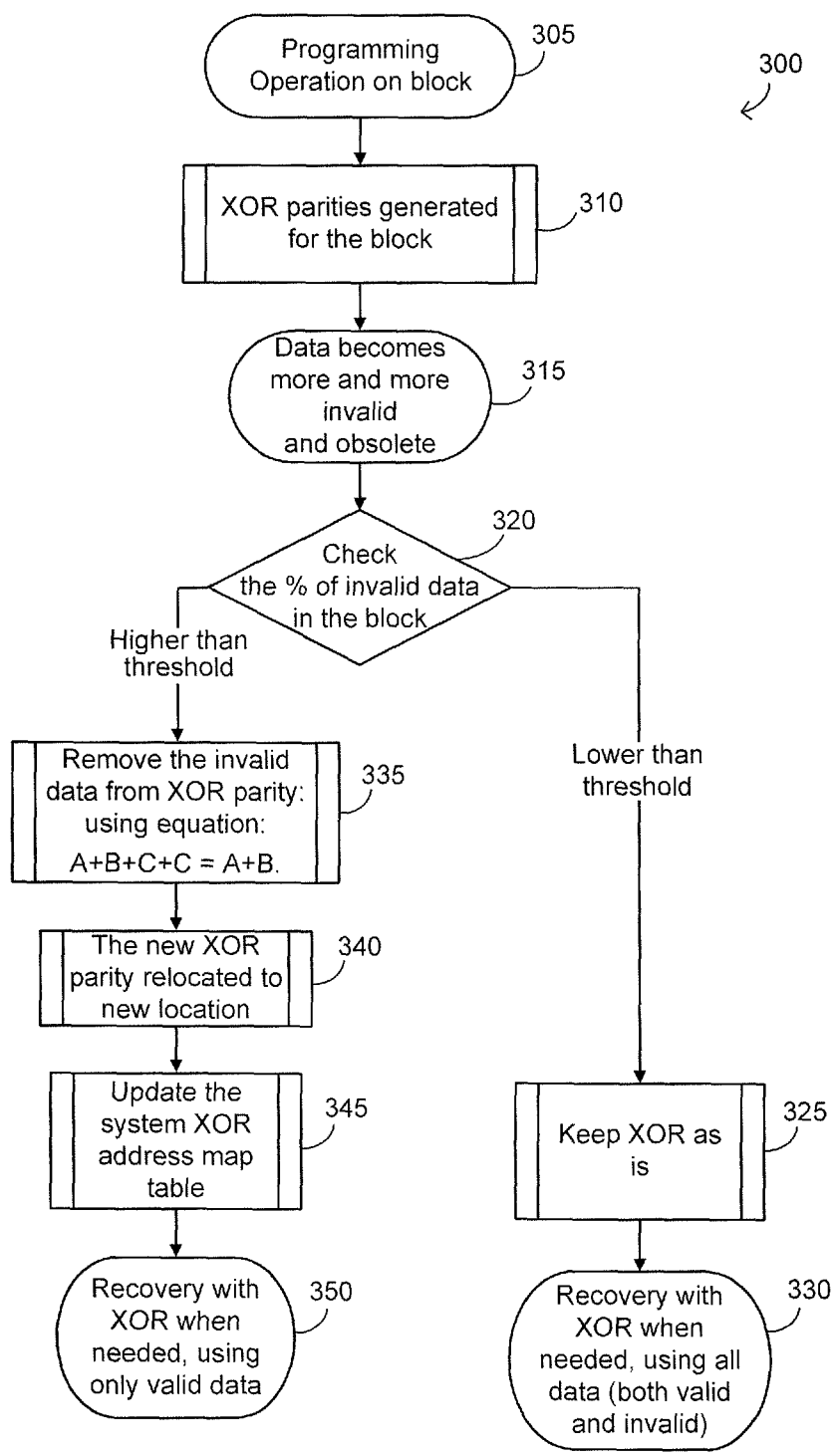
FIG. 3 is a flow chart of a method of an embodiment for reducing exclusive-or (XOR) recovery time.

Returning to the drawings FIG. 3 is a flow chart 300 of a method of an embodiment for reducing XOR recovery time. In one embodiment, this method is performed by the controller 102 of the storage system 100 (e.g., using the XOR engine 111 from FIG. 2A). As shown in FIG. 3, the controller 102 begins a programming operation on a block (act 305). In this particular embodiment, the fundamental unit of an XOR operation is a page, and XOR parity covers a block of pages or a "jumbo block" (e.g., a plurality of blocks) of pages. (An advantage of having XOR parity cover a jumbo block instead of a block is that it reduces the amount of XOR parities that need to be stored.) It should be noted that the terms "page," "block," and "jumbo block" are being used in this example as generic terms to denote granularity, and no specific size or characteristic is intended. Thus, as these terms are used herein, a "page," "block," and "jumbo block" can have any suitable size or characteristic, but a page is smaller than a block and a block is smaller than a jumbo block. Without it intending to be a limitation on the term, a jumbo block in this particular example has multiple physical blocks from different dies, such as when the memory takes the form of a three-dimensional memory, such as Bit Cost Scaling ("BiCS"), that has large memory blocks.

Figure 4:
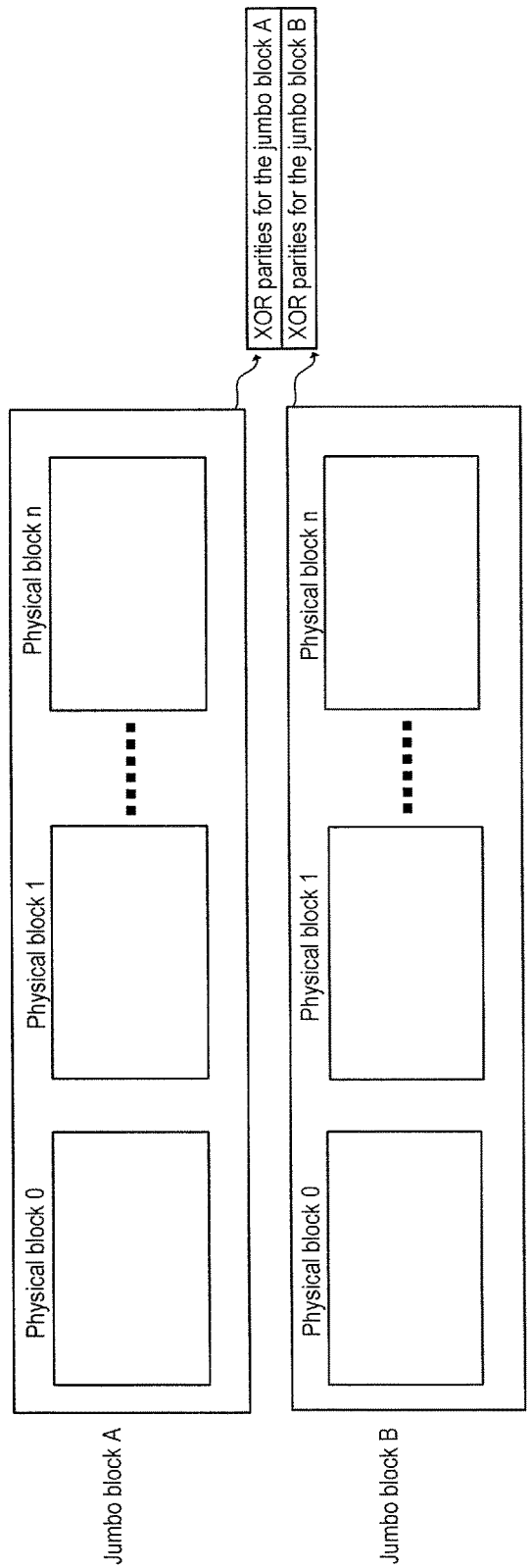
FIG. 4 is a diagram of a plurality of jumbo blocks of an embodiment.

Next, the controller 102 generates the XOR parities for block (act 310). In one embodiment, the controller 102 can generate the XOR parity as the data is being programmed to the memory page by page, and the XOR parity can be temporarily cached in the system RAM, as this operation is recursive for the following pages onto the same XOR parity. In other embodiments, the XOR parities are generated at different times (e.g., after the programming period). After a certain number of pages have been programmed (e.g., 25% of total pages that can be programmed to the block, which can be a conceptual logic block that may comprise multiple physical blocks from multiple dies of the storage system 100), the controller 102 can store the XOR parity to a fixed/predetermined location in the memory from the RAM. This fixed/predetermined location is sometimes referred to as a "local XOR zone." The controller 102 can start a new XOR parity for the next section of pages for the block and repeat this process until the block is fully programmed. If a program failure happens, the failing programming page can be recovered by using only the local XOR zone, which is faster than the general XOR that is for the entire block. As shown in FIG. 4, in this example, there are two jumbo blocks (A and B), each with a plurality of physical blocks (0-n), and there is an XOR parity covering each of the jumbo blocks.

Figure 5:
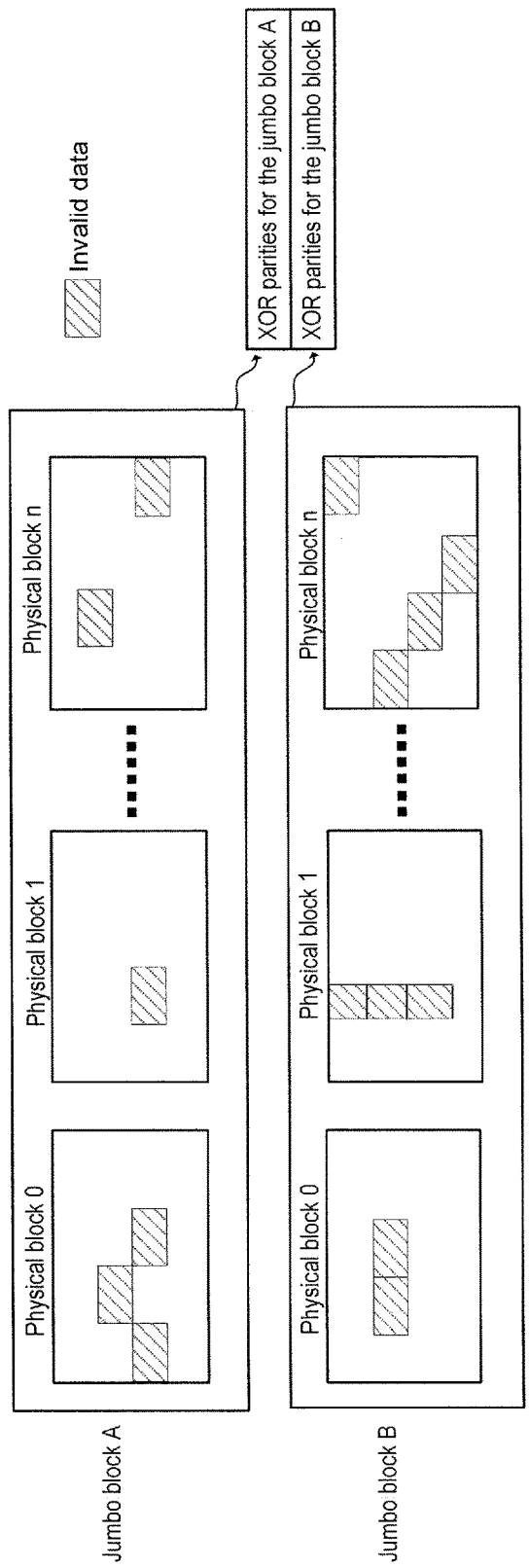
FIG. 5 is a diagram of a plurality of jumbo blocks of an embodiment showing invalid data.

Over time, more and more data in the jumbo blocks becomes invalid and obsolete (act 315). For example, once the programming is finished for the entire block, the data in the block may be subjected to the garbage collection or localized relocation (perhaps due to read scrub, etc.). The original data remaining in the block would be obsolete. This is shown in FIG. 5. Invalid/obsolete data can lead to longer recovery time as the invalid/obsolete data needs to be read during XOR recovery.

Figure 6:
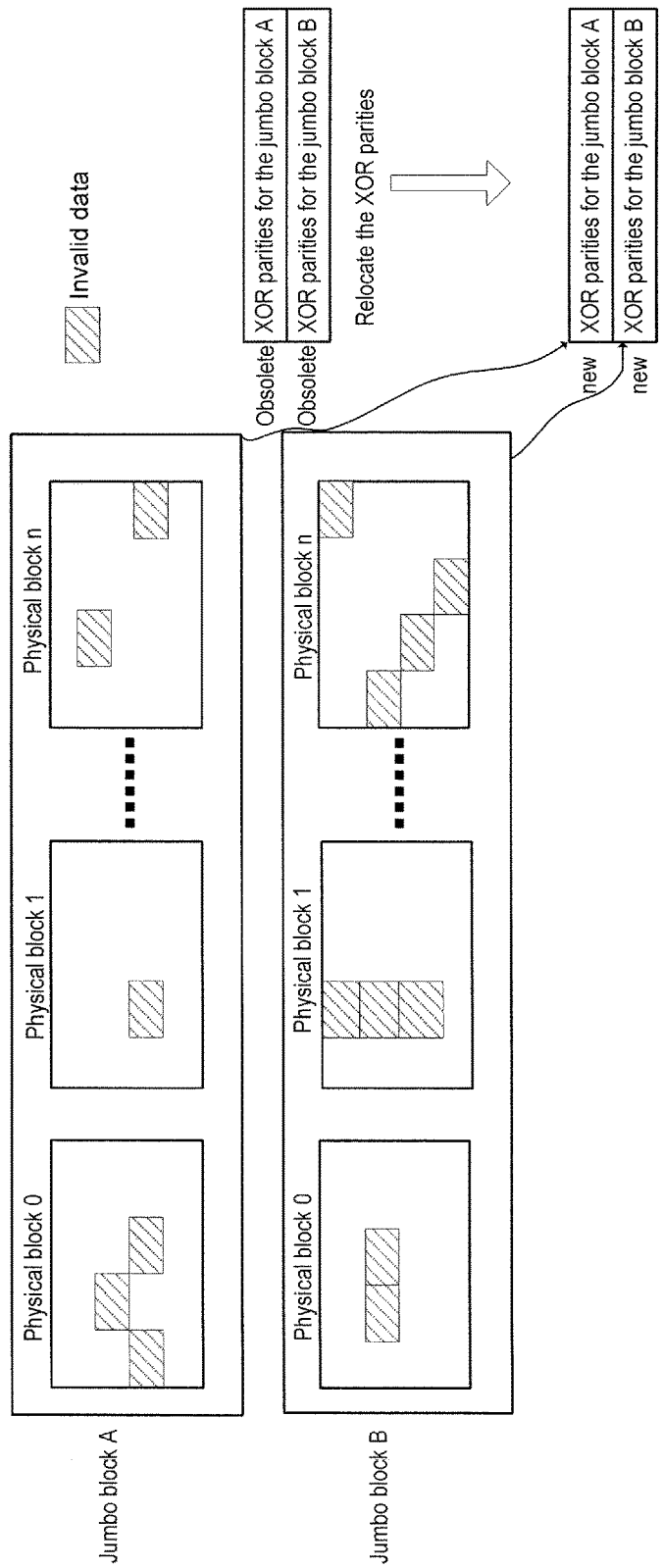
FIG. 6 is a diagram of the plurality of jumbo blocks of FIG. 5 with new XOR parities.

As mentioned above, XOR recovery time can be improved if these invalid/obsolete blocks were removed from the XOR parity (e.g., using the A⊕B⊕C⊕C=A⊕B principle discussed above). Removing these "pockets" of obsolete data not only speeds up the XOR recovery process, but it also removes data that may become vulnerable and create an XOR recovery weakness. While this compaction can be done at any point, the compaction process takes time, and it may be preferred to avoid performing the compaction every time a page of data becomes invalid, although such timing is possible. Any suitable triggering event or time can be used, and, in the embodiment, the triggering is done based on the percentage of invalid data in a block/jumbo block (act 320). So, if the percentage of invalid data is lower than a threshold, the XOR parity is kept as is (act 325), and both valid and invalid data is used in the XOR recovery process (act 330). However, if the percentage of invalid data is higher than the threshold, the invalid data is removed from the XOR parity (act 335), the new XOR parity is relocated to a new location (act 340), and the system XOR address map is updated (act 345). FIG. 6 shows the new, regenerated XOR parities that are relocated to new XOR parity locations (e.g., in an XOR parity area in the non-volatile memory) for further use, and FIG. 7 shows a system table with original and updated entries. This table allows the controller 102 to remember the XOR parity locations after each XOR parity regeneration and relocation. The blocks that have been under the XOR reduction can be recorded in a system table.

When a recovery process is needed, the new XOR parity can retrieved, and the "de-XORing" operation can be performed using only valid data (act 350). Since the recovery process will only use the valid data (which is less than 100% of the total data originally stored), the recovery will take less than 80% of the original recovery time. By reducing XOR recovery time, the controller 102 can prevent a time out during the error recovery process for the storage system 100, which can lead to a high performance and reliable storage system design with minimum host turn around time (HTAT).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A storage system comprising:
a memory; and
a controller in communication with the memory, wherein the controller is configured to:
generate a first exclusive-or (XOR) parity for pages of data written to the memory, wherein the pages of data are protected by a data protection scheme;
after the first XOR parity has been generated, determine whether a percentage of errors for the pages is above a threshold;
based on a determination that the percentage of errors for the pages is below the threshold:
determine that the data protection scheme cannot correct at least one error in a page; and
use the first XOR parity to recover the page that contains the error;
based on a determination that the percentage of errors for the pages is above the threshold:
generate a second XOR parity for the pages of data that excludes the at least one page of invalid data, wherein the second XOR parity is generated by performing an XOR operation using the first XOR parity and the at least one page of invalid data as inputs;
determine that the data protection scheme cannot correct an error in a page; and
use the second XOR parity to recover the page that contains the error, wherein using the second XOR parity to recover the page that contains the error is faster than using the first XOR parity to recover the page that contains the error.

2. The storage system of claim 1, wherein the controller is further configured to store the first XOR parity in a first location in the memory and is also further configured to store the second XOR parity in a second location in the memory.

3. The storage system of claim 2, wherein the controller is further configured to update an address map table to associate the pages of data with the second XOR parity stored in the second location in the memory instead of the first XOR parity stored in the first location in the memory.

4. The storage system of claim 1, wherein the first XOR parity is generated for a block of pages.

5. The storage system of claim 1, wherein the first XOR parity is generated for a plurality of blocks of pages.

6. The storage system of claim 1, wherein the memory comprises a three-dimensional memory.

7. The storage system of claim 1, wherein the storage system is embedded in a host.

8. The storage system of claim 1, wherein the storage system is removably connected to a host.

9. The storage system of claim 1, wherein the data protection scheme comprises error correction code.

10. A method comprising:
performing the following in a storage system comprising a memory:
creating first parity information for units of data written to the memory by performing a cumulative exclusive-or (XOR) operation on the units of data as they are written to memory, wherein the units of data are protected by a data protection scheme;
based on a determination that a percentage of units of data that are obsolete is below a threshold:
determining that the data protection scheme cannot correct an error in a unit of data; and
using the first parity information to recover the unit of data that contains the error;
based on a determination that the percentage of units of data that are obsolete is above the threshold:
creating second parity information by removing the at least one unit of obsolete data from the parity information by performing an XOR operation using the parity information and the at least one unit of obsolete data as inputs;
determining that the data protection scheme cannot correct an error in a unit of data; and
using the second parity information to recover the unit of data that contains the error, wherein using the second parity information to recover the unit of data is faster than using the first parity information to recover the unit of data.

11. The method of claim 10 further comprising storing the second parity information and updating a storage structure so that the units of data are associated with the second parity information.

12. The method of claim 10, wherein a unit of data is a page, and wherein the first parity information is created for at least one block of pages.

13. The method of claim 10, wherein the memory comprises a three-dimensional memory.

14. The method of claim 10, wherein the storage system is embedded in a host.

15. The method of claim 10, wherein the storage system is removably connected to a host.

16. The method of claim 10, wherein the data protection scheme comprises error connection code.

17. A storage system comprising:
a memory;
means for generating a first exclusive-or (XOR) parity for pages of data written to the memory, wherein the pages of data are protected by a data protection scheme;
means for after the first XOR parity has been generated, determining whether a percentage of errors for the pages is above a threshold;
based on a determination that the percentage of errors in the pages is below the threshold:
means for determining that the data protection scheme cannot correct an error in a page; and
means for using the first XOR parity to recover the page that contains the error;
based on a determination that the percentage of errors in the pages is above the threshold:
means for generating a second XOR parity for the pages of data that excludes the at least one page of invalid data, wherein the second XOR parity is generated by performing an XOR operation using the first XOR parity and the at least one page of invalid data as inputs;
means for determining that the data protection scheme cannot correct an error in a page; and
means for using the second XOR parity to recover the page that contains the error, wherein using the second XOR parity to recover the page that contains the error is faster than using the first XOR parity to recover the page that contains the error.

18. The storage system of claim 17, wherein the memory comprises a three-dimensional memory.

19. The storage system of claim 17, wherein the storage system is embedded in a host.

20. The storage system of claim 17, wherein the storage system is removably connected to a host.

21. The storage system of claim 17, wherein the data protection scheme comprises error correction code.

* * * * *